United States Patent
Iida et al.

(10) Patent No.: US 6,186,673 B1
(45) Date of Patent: Feb. 13, 2001

(54) PACKAGE FOR OPTICAL SEMICONDUCTOR MODULE

(75) Inventors: Masanori Iida, Katano; Hiroyuki Asakura, Osaka; Masaki Kobayashi, Yokohama, all of (JP)

(73) Assignee: Matsushita Electric Industrial Co., Ltd., Kadoma (JP)

( * ) Notice: Under 35 U.S.C. 154(b), the term of this patent shall be extended for 0 days.

(21) Appl. No.: 09/146,098

(22) Filed: Sep. 3, 1998

(30) Foreign Application Priority Data

Sep. 8, 1997 (JP) .................................................. 9-242503

(51) Int. Cl.$^7$ ...................................................... G02B 6/36
(52) U.S. Cl. .............................. 385/88; 257/684; 257/692
(58) Field of Search .......................... 385/88–94; 257/41, 257/99, 499, 503, 665, 678, 684, 690, 692, 697, 727, 728

(56) References Cited

U.S. PATENT DOCUMENTS 5,127,073 * 6/1992 Mulholland et al. ................. 385/92
5,539,767 * 7/1996 Nakanishi et al. ................... 372/109
5,596,171 * 1/1997 Harris et al. ........................ 174/52.4
5,971,628 * 10/1999 Dona et al. ............................ 385/88

FOREIGN PATENT DOCUMENTS

06163951 * 6/1994 (JP) .
07244228 * 9/1995 (JP) .

* cited by examiner

Primary Examiner—John D. Lee
Assistant Examiner—Michelle R. Connelly-Cushwa
(74) Attorney, Agent, or Firm—Wenderoth, Lind & Ponack, L.L.P.

(57) ABSTRACT

In a package mounting an optical semiconductor module, an optical semiconductor module is supported by a supporter fixed on a metallic base such that the optical semiconductor module is inclined relative to the circuit board. Further, a lead pin of the optical semiconductor module is set as high as a signal input/output line of a high frequency circuit board. The lead pin is fixed at the shortest distance to the signal input/output line with solder. Thus, the performance of the optical semiconductor module is not deteriorated, and the other components on the circuit board are not affected. A circuit board may be arranged below the optical semiconductor module.

20 Claims, 5 Drawing Sheets

Fig. 2 COMPARISON EXAMPLE
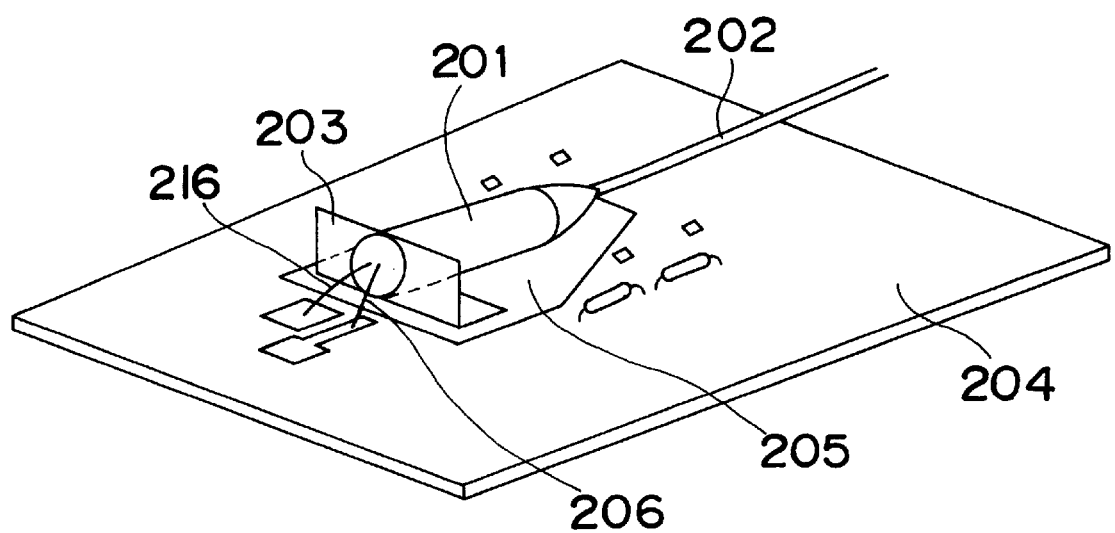
Fig. 3
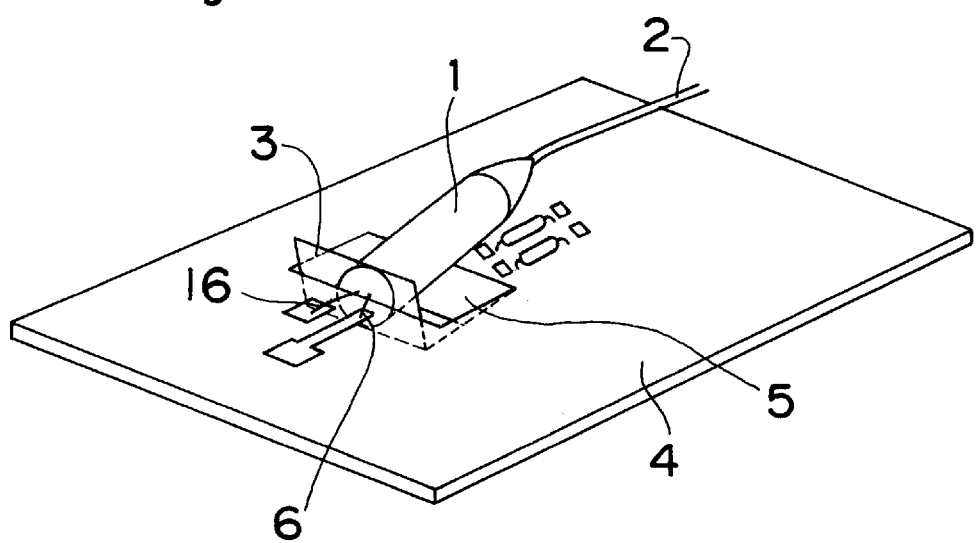

PACKAGE FOR OPTICAL SEMICONDUCTOR MODULE

BACKGROUND OF THE INVENTION

1. Field of the Invention

The present invention relates to an apparatus for optical communication including an optical semiconductor module.

2. Description of Related Art

When communication through an optical fiber is used for cable television, mobile communication and the like, a light transmission circuit for transmitting analog or digital signals through an optical fiber is required to operate at a high speed in a wide range.

An apparatus including an optical semiconductor module connected to an optical fiber is used for optical communication. Among optical semiconductor modules, a DFB laser module of butterfly type has input/output lines of electrical signals at two sides thereof. Then, its contour is suitable to be packaged on a high frequency circuit board. FIG. 1 shows an example of a prior art package for an optical semiconductor module of the butterfly type 101. A high frequency circuit board 104, fixed on a metallic base 105, has a hole for receiving the optical semiconductor module 101 of butterfly type therein. The optical semiconductor module 101 is connected to an optical fiber 102, while input/output lines 106 thereof are provided at two sides and are connected electrically to a high frequency circuit on the circuit board 104.

When a system is constructed, a key in system design is to provide a simple light transmission circuit at a low cost. A Fabry-Perot laser diode which can be produced at a lower cost is beginning to be used for transmitting light signals instead of an expensive DFB laser. A Fabry-Perot laser diode module has a coaxial contour, and the input/output line of electrical signals of such a module extends along a longitudinal direction thereof. However, it is not necessarily suitable to be mounted to a high frequency circuit board.

SUMMARY OF THE INVENTION

An object of the present invention is to provide a package including an optical semiconductor module having good performance at high Lrequencies.

In a first aspect of the present invention, a package for optical semiconductor module comprises a base, a circuit board fixed to the base, and an optical semiconductor module. The module has an input/output pin thereof positioned so as to coincide with that of a signal input/output line provided on the circuit board. The input/output pin of the optical semiconductor module is connected electrically at the position to the signal input/output line of the circuit board. Thus, the input/output pin of the optical semiconductor module can be connected electrically to the signal input/output line of the circuit board at the shortest distance. An optical semiconductor is a term used to designate a semiconductor element which emits or receives a light signal, such as a laser diode, a light emitting diode, a photodiode or a composite device thereon.

In another aspect of the present invention, a package for an optical semiconductor module comprises a base, a circuit board fixed to the base, and an optical semiconductor module connected electrically to the optical semiconductor module. A longitudinal direction of the optical semiconductor module is oblique relative to the circuit board. Then, the circuit board can be provided below the optical semiconductor module. Thus, packaging density of the circuit is improved.

In a further aspect of the invention, a package for an optical semiconductor module comprises a base, an optical semiconductor module, and a circuit board fixed to the base and connected electrically to the optical semiconductor module. The circuit board extends to below the optical semiconductor module. Thus, packaging density of the circuit is improved.

An advantage of the present invention is that a package having an optical semiconductor module has good conversion efficiency from electrical to light signals.

Another advantage of the present invention is that a packaging efficiency on a circuit board is improved in a package having an optical semiconductor module.

BRIEF DESCRIPTION OF THE DRAWINGS

These and other objects and features of the present invention will become clear from the following description taken in conjunction with the preferred embodiments thereof with reference to the accompanying drawings, and in which:

FIG. 2 is a schematic perspective view of a comparison example of a package including an optical semiconductor module of the coaxial type;

FIG. 3 is a schematic perspective view of a package of an optical semiconductor module of the coaxial type of a first embodiment of the present invention;

DETAILED DESCRIPTION OF THE PREFERRED EMBODIMENTS

Figure 1:
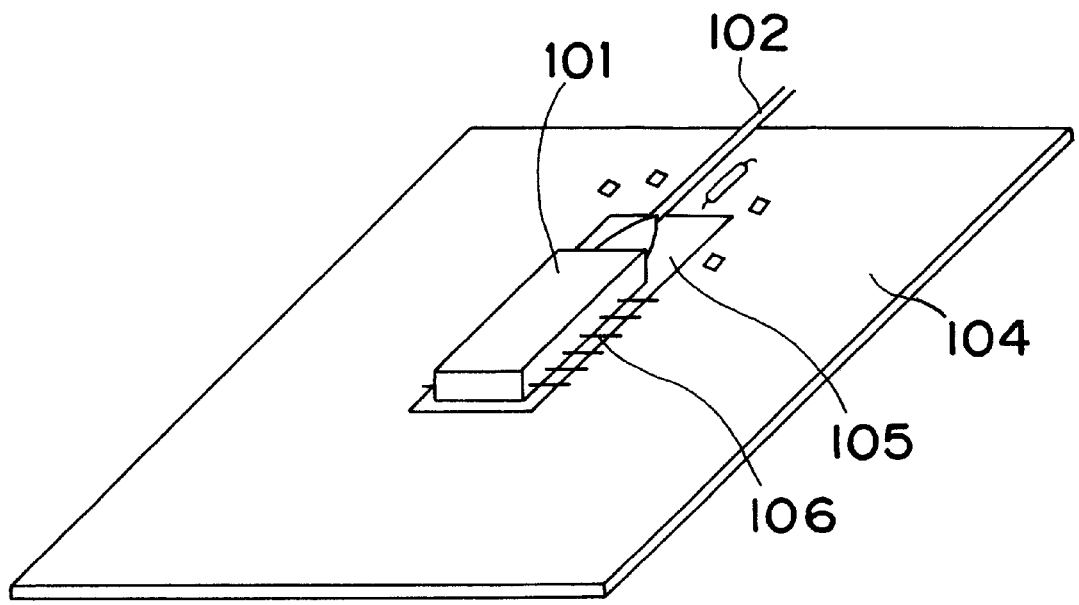
FIG. 1 is a schematic perspective view of a prior art package including an optical semiconductor module of the butterfly type.

Referring now to the drawings, wherein like reference characters designate like or corresponding parts throughout the several views, embodiments according to the invention are explained below. Before explaining the embodiments, a comparison example is explained first to explain a problem for a package including a coaxial module with reference to FIG. 2. A coaxial module 201 of an optical semiconductor is a type having a ground pin 216 at the same side as a lead pin 206. A high frequency circuit board 204 is fixed to a metallic base 205. The metallic base 205 has a space for receiving the coaxial module 201, and it has a similar pattern of the contour of the coaxial module 201. An L clamp 203 having the shape of the character L is arranged in the space and fixed to the metallic base 205. The optical semiconductor module 201, which is a light-emitting device such as a Fabry-Perot laser diode, is mounted to the L clamp 203. The optical device module 201 is connected at an end thereof to an optical fiber 202, while the lead pin 206, provided at the other end, is connected to the high frequency circuit board 204. Thus, the optical device module 201 is supported by the L clamp 203 and fixed to the metallic base 205 as well as the high frequency circuit board 204.

In the above-mentioned structure, an electrical signal from the high frequency circuit board 204 is supplied via the lead pin 206 to the optical semiconductor module 201, and it is converted to a light signal to be sent through the optical fiber 202. The length of the lead pin 206, connecting the optical semiconductor module 201 to the high frequency circuit board 204, is conventionally 4–mm in the package because the radius of the coaxial module 201 is 3 mm.

A problem associated with the package including the optical device module is that because an electrical signal is supplied through the long lead pin 206 to the optical device module 201, a stray capacitance of the lead pin 206 affects transmission characteristics of high frequency signals between the high frequency circuit board 204 and the optical device module 201. Thus, when the lead pin 206 connecting the optical semiconductor module 201 to the high frequency circuit board 204 is long, it is a problem that the conversion efficiency from an electrical signal to an optical signal is deteriorated at the high frequency range.

Figure 4:
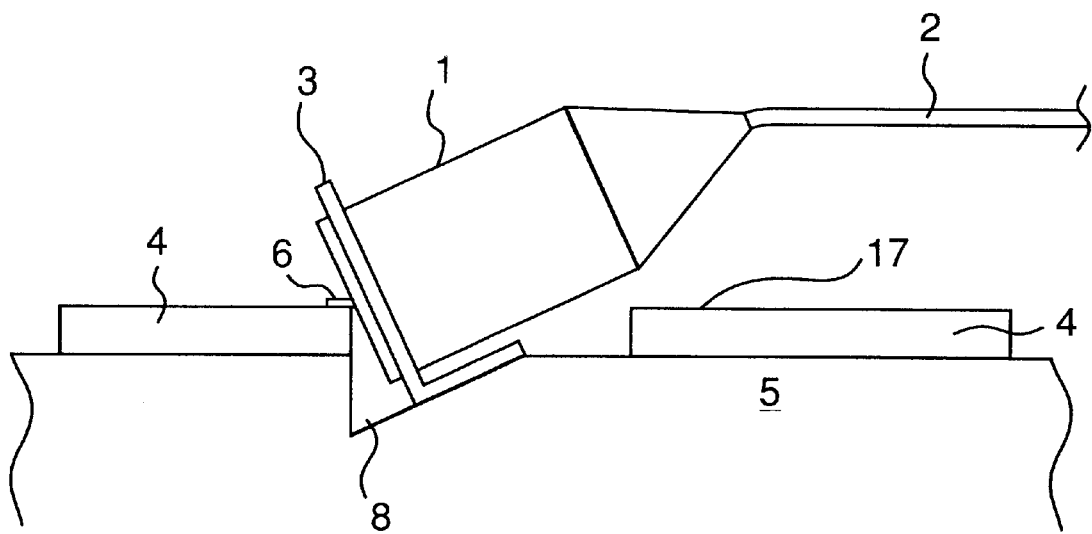
FIG. 4 is a schematic sectional view of the package shown in FIG. 3.

FIG. 3 is a perspective view of a package including an optical semiconductor module 1 of the coaxial type of a first embodiment of the invention, and FIG. 4 shows a sectional view thereof. The optical semiconductor module 1 is a light emitting element such as a Fabry-Perot laser diode (FB-LD). A metallic base 5 is for example a box, containing the optical semiconductor module 1, but its entire shape is not shown the purpose of simplifying the drawing. It has a pit 8 for controlling the height of the optical semiconductor module 1. The pit 8 is a triangular recess having a vertical side and a slope side. Also, an L clamp 3, having the shape of character L, is fixed to the slope side. The L clamp 3 supports the optical semiconductor module 1 having a coaxial contour so that the longitudinal direction of the module 1 is inclined relative to the surface of the metallic base 5. Thus, the axial optical semiconductor module 1 is fixed to a vertical portion of the L clamp 3, and its longitudinal direction extends perpendicularly relative to the vertical portion. A high frequency circuit board 4 is fixed to the metallic base 5 and has a space above the height control pit 8. A short lead pin 6, extending from an end of the module 1 to the circuit board 4, has a length equal to or shorter than 1 mm and it is located at a position just near a signal input/output line 16 of the high frequency circuit board 4. By supporting the module 1 with the L clamp 3 as explained above, the position of the input/output pin of the module can be controlled so as to coincide with that of the signal input/output line of the high frequency circuit board 4. Then it is connected electrically with solder at the position to the signal input/output line which extends to an edge of the high frequency circuit board 4. in other words, the L clamp 3 supports the optical semiconductor 1 so that the short lead pin 6 is positioned at the signal input/output line of the high frequency circuit board 4. The other end of the optical semiconductor module 1 is connected to an optical fiber 2 which extends to the outside of the package.

If the length of the module 1 from the end at the lead pin 6 to the other end connected to the optical fiber 2 is denoted as L and the angle of inclination thereof is denoted as θ, the height H of the module 1 at the other end connected to the optical fiber 2 has a following relation: H=L·sinθ. It is not desirable for the packaging efficiency that the height H is larger than about 10 mm, while it is also not desirable that the height H is smaller than about 5 mm, in order to arrange a circuit below the module 1. Then, it is preferable that 5 mm≦H≦10 mm. For a module having the length L of about 30 mm, it is preferable that 10°≦θ≦25°.

It is to be noted that the high frequency circuit board 4 extends to a portion or surface 17 below the optical semiconductor module 1, and electronics parts and electrical circuit lines are arranged at the portion 17. Thus, a part of the circuit is provided below the module 1, and packaging density of the circuit is increased.

When the package explained above is assembled, first the high frequency circuit board 4 is mounted to the metallic base 5. Further, the optical semiconductor module 1 is fixed to the L clamp 3. Then, the L clamp 3 is fixed to the height control pit 8 so that the height of the lead pin 6 is equal to that of the signal input/output line of the high frequency circuit board 4. Because the plane on which the L clamp 3 is fixed is inclined so as to rise rightward in FIG. 4, the longitudinal direction of the optical semiconductor module 1 is arranged to be inclined relative to the signal input/output line of the high frequency circuit board 4. Then, the lead pin 6 is connected with solder to the signal input/output line.

When the high frequency circuit in the package is operated, high frequency electrical signals are guided from the high frequency circuit board 4 through the short lead pin 6 to the optical semiconductor module which converts them to light signals. Then, the light signals are transmitted through the optical fiber 2.

Figure 5:
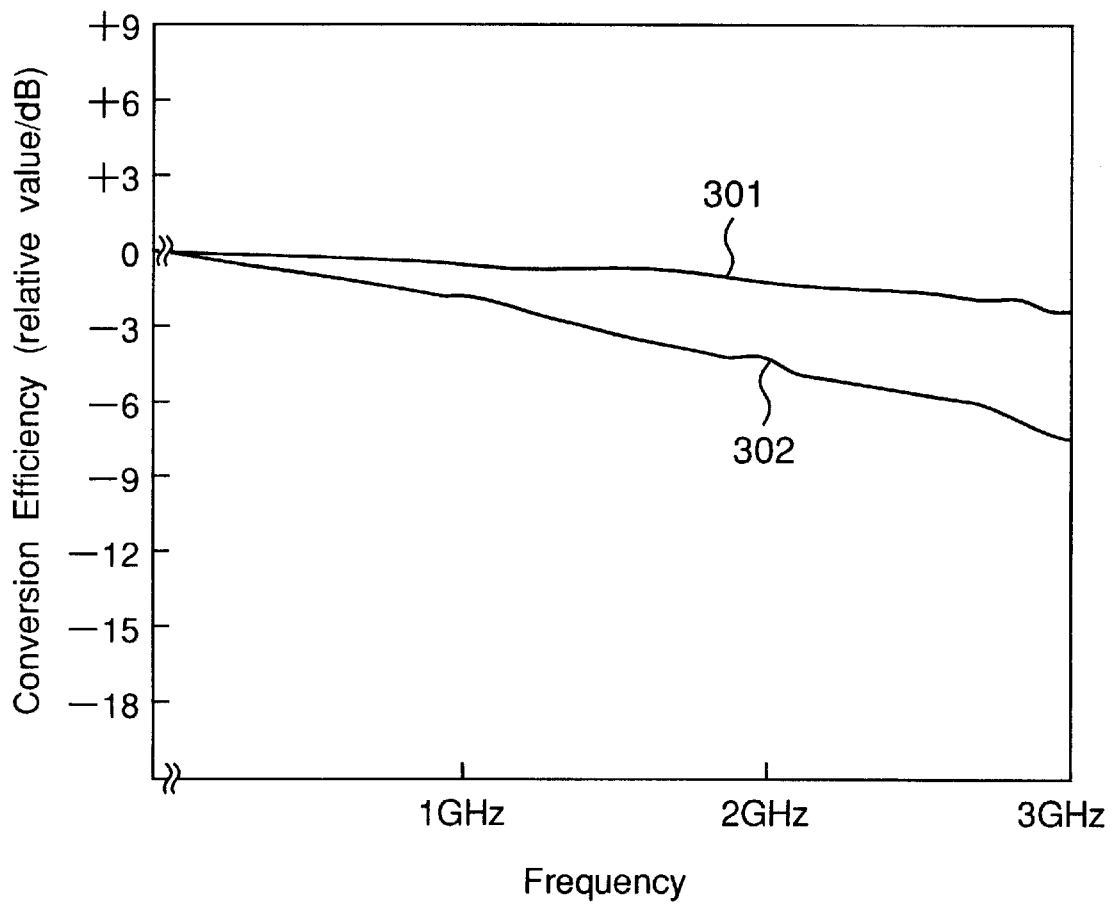
FIG. 5 is a graph on frequency dependence of conversion efficiency from electrical to light signal when the module is fixed to a board.

FIG. 5 shows examples of frequency characteristics on conversion from an electric signal to an optical signal when a Fabry-Perot laser diode is used as the optical semiconductor module. A characteristic curve 301 corresponds to a case where the pin 6, connecting the optical semiconductor module 1 to the high frequency circuit board 4, has a length equal to or shorter than 1 mm, as shown in FIGS. 3 and 4, while another characteristic curve 302 corresponds to a case where the pin 206 is long as shown in FIG. 2. The curve 301 shows that the conversion efficiency of electrical signals supplied from the high frequency circuit board 4 is constant in the frequency range shown in FIG. 5. On the contrary, the curve 302 for the long lead pin in the comparison example has a lower conversion efficiency at frequency range especially above 1 GHz. That is, the high frequency electrical signals have about the same frequency dependence of conversion efficiency from electrical to light signals as those inherent in the optical semiconductor module 1, as shown in FIG. 5.

In the above-mentioned package for the optical semiconductor module, the shortened lead pin 6 connects the optical semiconductor module 1 electrically with the high frequency circuit board 4. Such a structure can be fabricated easily by providing the height control pit 8 on a part of the metallic base 5. Further, because the optical semiconductor module 1 is arranged obliquely, electronics parts can also be mounted on the part 17 of the print circuit board 4, and packaging efficiency is improved. Because a low-cost coaxial optical device can be used as the optical semiconductor module 1, the package can be used practically and its productivity is high.

Figure 6:
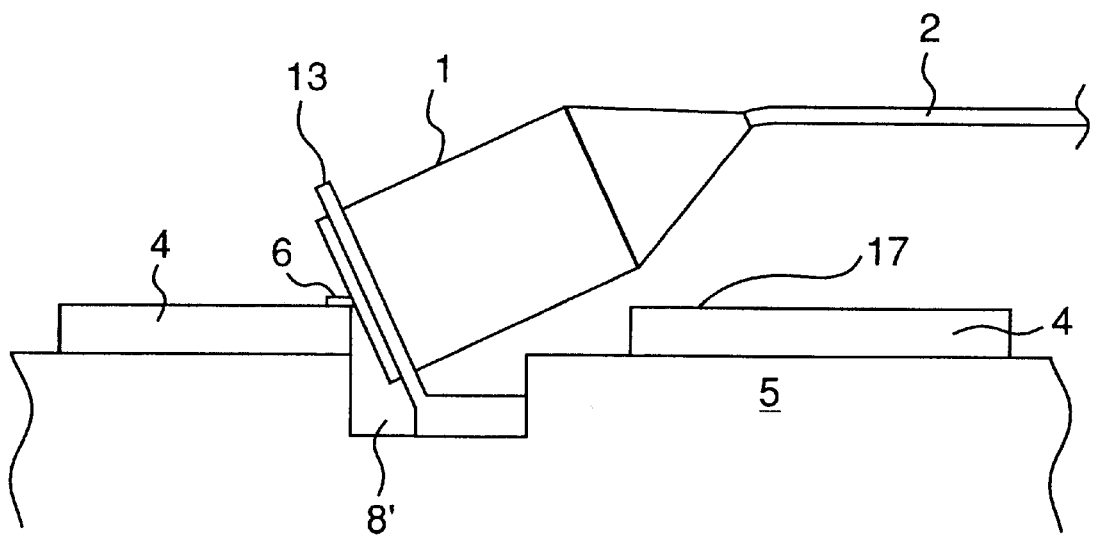
FIG. 6 is a schematic sectional view of a package of an optical semiconductor module of a second embodiment of the invention.

FIG. 6 shows another package for an optical semiconductor module of coaxial type of a second embodiment of the invention. This circuit is different from that of the first embodiment only as follows. In the second embodiment, an L clamp is a module supporter 13 which holds the optical semiconductor module 1 obliquely. Also, a height control pit 8' is formed a shape with that corresponds to the module supporter 13. The height control pit 8' does not have a slope surface, but has a flat plane bottom in parallel to the supporting surface of the metallic base 5.

By using the module supporter 13, the slope of the height control pit 8, shown in FIG. 5, is not needed, and the metallic base 5 can be fabricated more easily. Further, the height control becomes easier between the lead pin 6 of the optical semiconductor module 1 and the signal input/output line of the high frequency circuit board 4.

Figure 7:
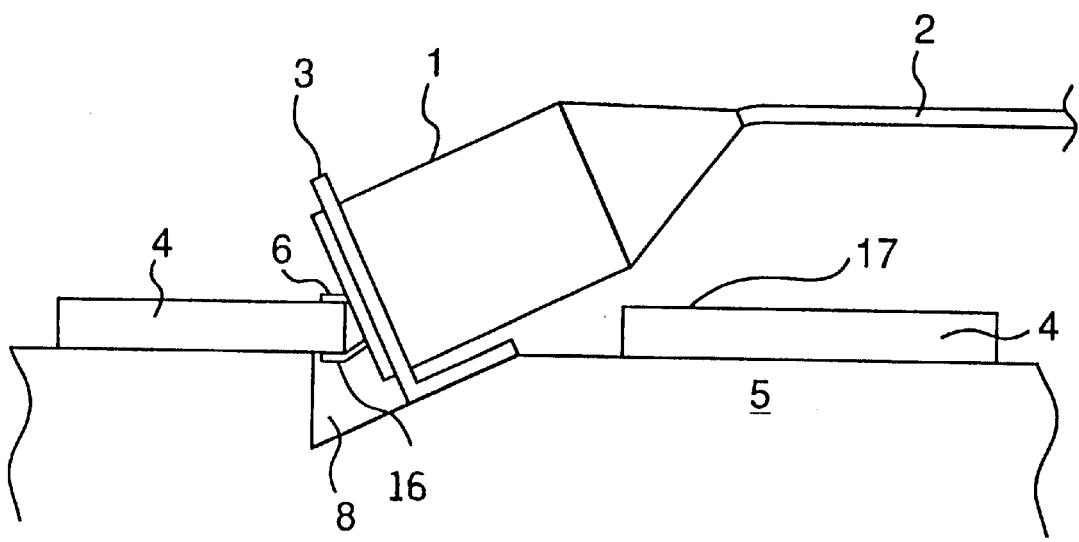
FIG. 7 is a schematic sectional view of a package of an optical semiconductor module of a third embodiment of the invention.

FIG. 7 shows a different package for an optical semiconductor module 1 of the coaxial type constructed in accordance with a third embodiment of the invention. This construction is different from that of the first embodiment only as follows. The coaxial module 1 including an optical semiconductor is of a type having a ground pin 16 located at the same side as the lead pin 6. The rear plane or surface of the high frequency circuit board 4 has a ground pad, and the ground pin 16 of the optical semiconductor module 1 is connected to the ground pad on the rear plane of the high frequency circuit board 4. A height control pit 8 is extended to a portion below the rear plane of the high frequency circuit board 4 at the side of optical semiconductor module 1.

Because the high frequency circuit board 4 is interposed between the lead pin 6 and the ground pin 16 of the optical semiconductor module 1, the ground of the optical semiconductor module 1 is connected at the shortest distance to that of the high frequency circuit board 4. Thus, the response characteristics at high frequencies can be ensured. It is to be noted that if the signal input/output line of the high frequency circuit board 4 is made of a micro-strip line, the connection position of the ground pin 16 is not limited because all of the rear plane of the high frequency circuit board 4 is the ground.

In the above-mentioned embodiments, a Fabry-Perot laser diode is used as the optical semiconductor module 1, but a different optical light-emitting device may also be used. For example, the optical semiconductor module 1 can be a different type of laser diode module or a light-emitting-diode module. Further, in the above-mentioned embodiments, a light-emitting device is used as the optical semiconductor module 1, but a light-receiving device can also be used as the optical semiconductor module 1. For example, the optical semiconductor module 1 may be a photodiode module. Further, it may be a composite module including a light-emitting device such as a laser diode and a light-receiving element such as a photodiode.

Figure 8:
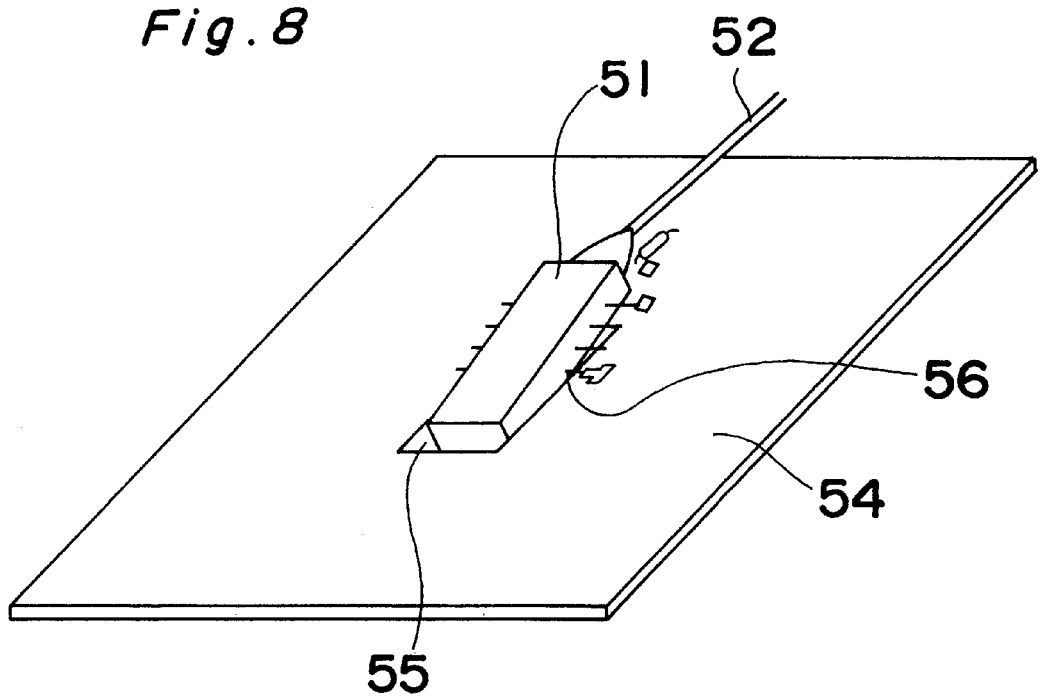
FIG. 8 is a perspective view of a package of an optical semiconductor module of the butterfly type.

Further, in the above-mentioned embodiments, because a low-cost coaxial module is used as the optical semiconductor module 1, the packaging circuit can be used practically and its productivity is high. However, the contour of the optical semiconductor module 1 is not limited thereto. For example, even for a module of the butterfly type, a signal input/output pin thereof for high frequency signals is set to have the same height as that of the high frequency circuit board 4 and the ground between the module 1 and the circuit board 4 is connected surely. FIG. 8 is a perspective view of an apparatus for an optical semiconductor module 51 of the butterfly type. A metallic base 55 is for example a box, but its entire shape is not shown in order to simplify the drawing. A high frequency circuit board 54 is fixed to the metallic base 55, and it has a hole for receiving the optical semiconductor module 51. The metallic base 55 has a pit below the hole for controlling the height of the optical semiconductor module 51. Thus, the longitudinal direction of the module 51 is inclined relative to the surface of the metallic base 55. A short input/output line 56 used for high frequency signals among the input/output lines of the module 51, is connected to a signal input/output line of the high frequency circuit board 54. The connection of the other input/output lines is omitted here in order to simply of the drawing. By supporting the module 51 as explained above, the position of the input/output line of the module is set to agree with that of the signal input/output line of the high frequency circuit board 54. The other end of the optical semiconductor module 51 is connected to an optical fiber 52.

As explained above, in the packages for optical semiconductor modules in the above-mentioned embodiments, the lead pin 6, which is shortened, connects the optical semiconductor module 1 with the signal input/output line of the high frequency circuit board 4, and the optical semiconductor module 1 is arranged obliquely. Therefore, the optical semiconductor module 1 can be set or mounted without modifying the shape of the high frequency circuit board largely, while the high frequency electrical signals have surely about the same frequency dependence of conversion efficiency from electrical to light signals as that inherent in the optical semiconductor module 1.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A package for an optical semiconductor module, said package comprising:
   a base;
   a circuit board fixed on an upper surface of said base and having a signal input/output line formed thereon;
   an optical semiconductor module disposed on an opposite side of said circuit board relative to said base, said optical semiconductor module having an input/output pin positioned so as to coincide with the signal input/output line formed on said circuit board, the input/output pin of said optical semiconductor module being connected electrically to the signal input/output line of said circuit board; and
   an optical fiber connected to said optical semiconductor module at a position different from the input/output pin of said optical semiconductor module,
   wherein said optical fiber is positioned at a level that is higher than electronic parts fixed to said circuit board.

2. The package as claimed in claim 1, further comprising a support structure fixed to said base, said support structure connected to said optical semiconductor module such that the input/output pin is positioned to coincide with the signal input/output line of said circuit board.

3. The package as claimed in claim 2, wherein said support structure is made of metal.

4. The package as claimed in claim 2, wherein said base has a recess, and said support structure is fixed to a surface of the recess.

5. The package as claimed in claim 2, wherein said support structure supports said optical semiconductor module obliquely relative to said circuit board.

6. The package as claimed in claim 5, wherein a portion of said circuit board extends beneath said optical semiconductor module.

7. The package as claimed in claim 1, wherein said optical semiconductor module has a ground pin located at the same side of said optical semiconductor module as the input/output pin, and the ground pin is connected electrically to a ground pad provided on a side of said circuit board that is opposite relative to a side of said circuit board on which the signal input/output line is provided.

8. The package as claimed in claim 1, wherein said circuit board has a high frequency circuit including said optical semiconductor module.

9. The package as claimed in claim 1, wherein said optical semiconductor module is a coaxial module.

10. The package as claimed in claim 1, wherein said optical semiconductor module is a butterfly type module.

11. A package for an optical semiconductor module, said package comprising:

a base;

a circuit board fixed to said base; and an optical semiconductor module connected electrically to said circuit board, wherein a longitudinal direction of said optical semiconductor module is oblique relative to said circuit board.

12. The package as claimed in claim 11, further comprising a support structure fixed to said base, said support structure being connected to said optical semiconductor module such that the longitudinal direction of said optical semiconductor module is oblique relative to said circuit board.

13. The package as claimed in claim 11, wherein said base has a recess, and said support structure is fixed to a surface of the recess.

14. The package as claimed in claim 11, wherein said optical semiconductor module is a coaxial module.

15. A package for optical semiconductor module, said package comprising:

a base;

an optical semiconductor module;

a circuit board fixed to said base and connected electrically to said optical semiconductor module, which is positioned on an opposite side of said circuit board relative to said base; and an optical fiber connected to said optical semiconductor module at a position that is different from said input/output pin of said optical semiconductor module, wherein said circuit board extends below said optical semiconductor module, and said optical semiconductor module and said optical fiber are positioned so that electronic parts can be fixed to said circuit board under said optical semiconductor module and said optical fiber.

16. The package as claimed in claim 15, wherein a longitudinal direction of said optical semiconductor module is oblique relative to said circuit board.

17. The package as claimed in claim 15, further comprising a support structure fixed to said base, said support structure being connected to said optical semiconductor module such that the longitudinal direction of said optical semiconductor module is oblique relative to said circuit board.

18. The package as claimed in claim 17, wherein said base has a recess, and said support structure is fixed in said recess.

19. The package as claimed in claim 15, wherein said optical semiconductor module is a coaxial module.

20. The package as claimed in claim 15, wherein said circuit board has a high frequency circuit including said optical semiconductor module.

* * * * *